(12) United States Patent
Maehashi et al.

(10) Patent No.: US 10,971,539 B2
(45) Date of Patent: Apr. 6, 2021

(54) SOLID-STATE IMAGING DEVICE, METHOD OF DRIVING SOLID-STATE IMAGING DEVICE, IMAGING SYSTEM, AND MOVABLE OBJECT

(71) Applicant: CANON KABUSHIKI KAISHA, Tokyo (JP)

(72) Inventors: Yu Maehashi, Yokohama (JP); Yasuji Ikeda, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/292,049

(22) Filed: Mar. 4, 2019

(65) Prior Publication Data
US 2019/0305030 A1    Oct. 3, 2019

(30) Foreign Application Priority Data
Mar. 30, 2018  (JP) .............................. JP2018-067058

(51) Int. Cl.
*H01L 27/146*     (2006.01)
*H04N 5/3745*     (2011.01)
(Continued)

(52) U.S. Cl.
CPC .......... *H01L 27/14643* (2013.01); *B60R 1/00* (2013.01); *H01L 31/107* (2013.01);
(Continued)

(58) Field of Classification Search
CPC ............ H01L 31/107; H01L 27/14643; H04N 5/3765
See application file for complete search history.

(56) References Cited

U.S. PATENT DOCUMENTS 7,115,963 B2  10/2006  Augusto
7,897,906 B2   3/2011  Deschamps
(Continued)

FOREIGN PATENT DOCUMENTS

GB    2269010    1/1994
GB    2509545    7/2014
(Continued)

OTHER PUBLICATIONS

Cronin, D., et al., "Intelligent System for Optimal Hold-Off Time Selection in an Active Quench and Reset IC", IEEE Journal of Selected Topics in Quantum Electronics, vol. 13, No. 4, Jul./Aug. 2007, pp. 911-918.
(Continued)

*Primary Examiner* — Christopher K Peterson
(74) *Attorney, Agent, or Firm* — Venable LLP

(57) ABSTRACT

A solid-state imaging device includes a photon detector that operates in a Geiger mode and outputs an output signal in accordance with incidence of a photon, a quench element that causes the photon detector to transition to a non-Geiger mode in accordance with the output signal, a control unit that, when the photon detector transitions from a Geiger mode to a non-Geiger mode, switches the quench element from a detection mode, in which the quench element is in a relatively low resistance state and the photon detector detects a photon, to a hold mode, in which the quench element is in a relatively high resistance state and holds the output signal, and a signal processing circuit that performs a predetermined process on the output signal.

24 Claims, 7 Drawing Sheets

(51) Int. Cl.
*B60R 1/00* (2006.01)
*H01L 31/107* (2006.01)
*H04N 5/376* (2011.01)
*H04N 5/369* (2011.01)

(52) U.S. Cl.
CPC ...... *H04N 5/37455* (2013.01); *B60R 2300/10* (2013.01); *B60R 2300/60* (2013.01); *B60R 2300/8093* (2013.01); *H04N 5/3765* (2013.01)

(56) References Cited

U.S. PATENT DOCUMENTS

| | | |
|---|---|---|
| 8,017,900 B2 | 9/2011 | Mathewson |
| 8,598,901 B2 | 12/2013 | Hiyama |
| 8,711,259 B2 | 4/2014 | Maehashi |
| 8,785,832 B2 | 7/2014 | Ikeda |
| 9,159,750 B2 | 10/2015 | Ikeda |
| 9,270,913 B2 | 2/2016 | Hiyama |
| 9,407,847 B2 | 8/2016 | Maehashi |
| 9,438,839 B2 | 9/2016 | Hiyama |
| 9,549,139 B2 | 1/2017 | Ikeda |
| 9,671,284 B1 | 6/2017 | Dandin |
| 9,762,840 B2 | 9/2017 | Yamazaki |
| 9,942,497 B2 | 4/2018 | Ikeda |
| 9,952,323 B2 | 4/2018 | Deane |
| 9,986,194 B2 | 5/2018 | Maehashi |
| 2010/0214654 A1 | 8/2010 | Birk |
| 2012/0205522 A1* | 8/2012 | Richardson ............ H04N 5/378 250/214.1 |
| 2016/0349371 A1* | 12/2016 | Suzuki .................. G01S 17/931 |
| 2017/0131143 A1* | 5/2017 | Andreou .................. G01J 1/44 |
| 2017/0237912 A1 | 8/2017 | Takenaka |
| 2018/0006071 A1 | 1/2018 | Kato |

FOREIGN PATENT DOCUMENTS

| | | |
|---|---|---|
| JP | 2005-517300 | 6/2005 |
| JP | 2006-179587 | 7/2006 |
| JP | 2008-542706 | 11/2008 |
| JP | 2010-521825 | 6/2010 |
| JP | 2017-520134 | 7/2017 |
| WO | 03/067663 | 8/2003 |
| WO | 2006/126026 | 11/2006 |
| WO | 2008/116292 | 10/2008 |
| WO | 2015/157341 | 10/2015 |

OTHER PUBLICATIONS

European Search Report dated Jul. 24, 2019 during prosecution of related European application No. 19162140.8.
U.S. Appl. No. 16/365,952, filed Mar. 27, 2019, by Yosuke Nishide.
U.S. Appl. No. 16/353,964, filed Mar. 14, 2019, by Shintaro Takenaka.

* cited by examiner

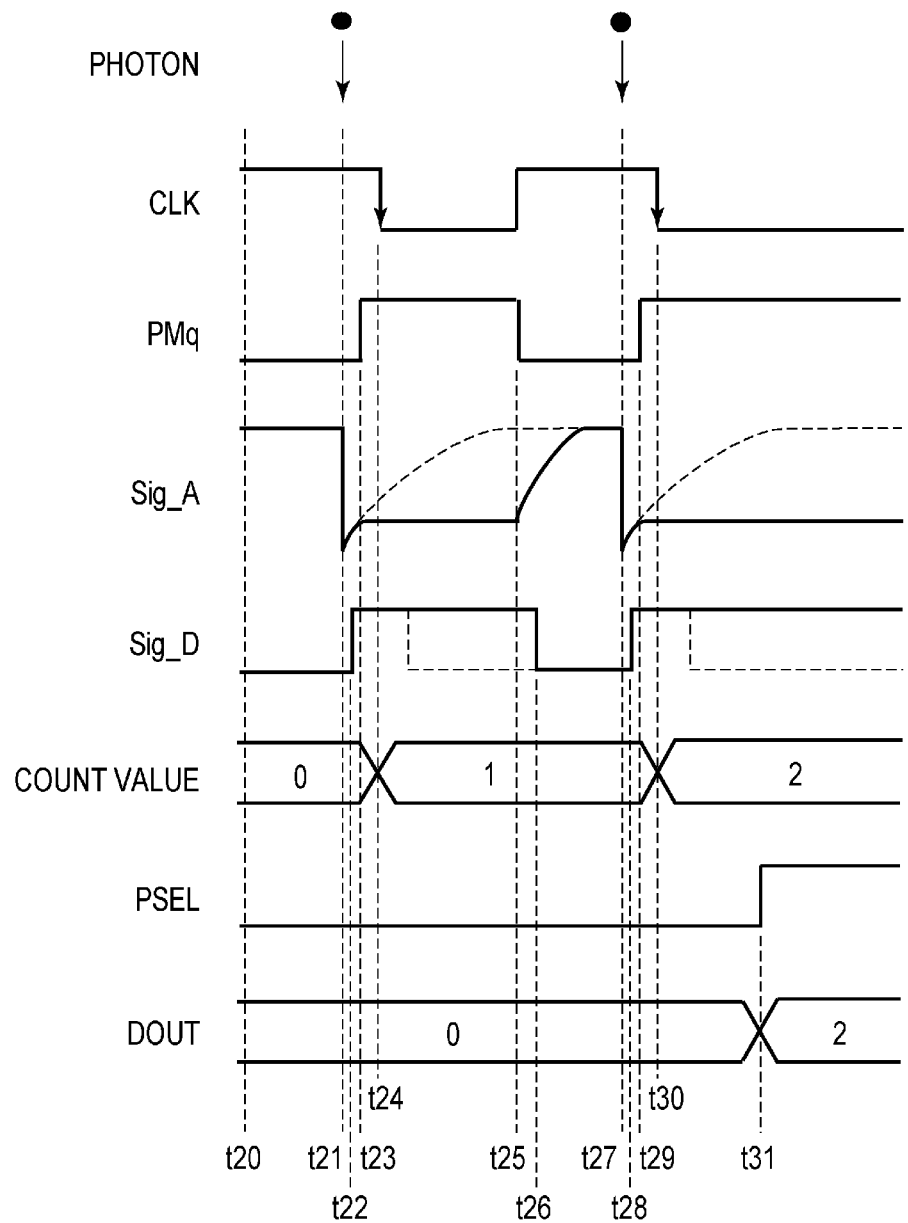

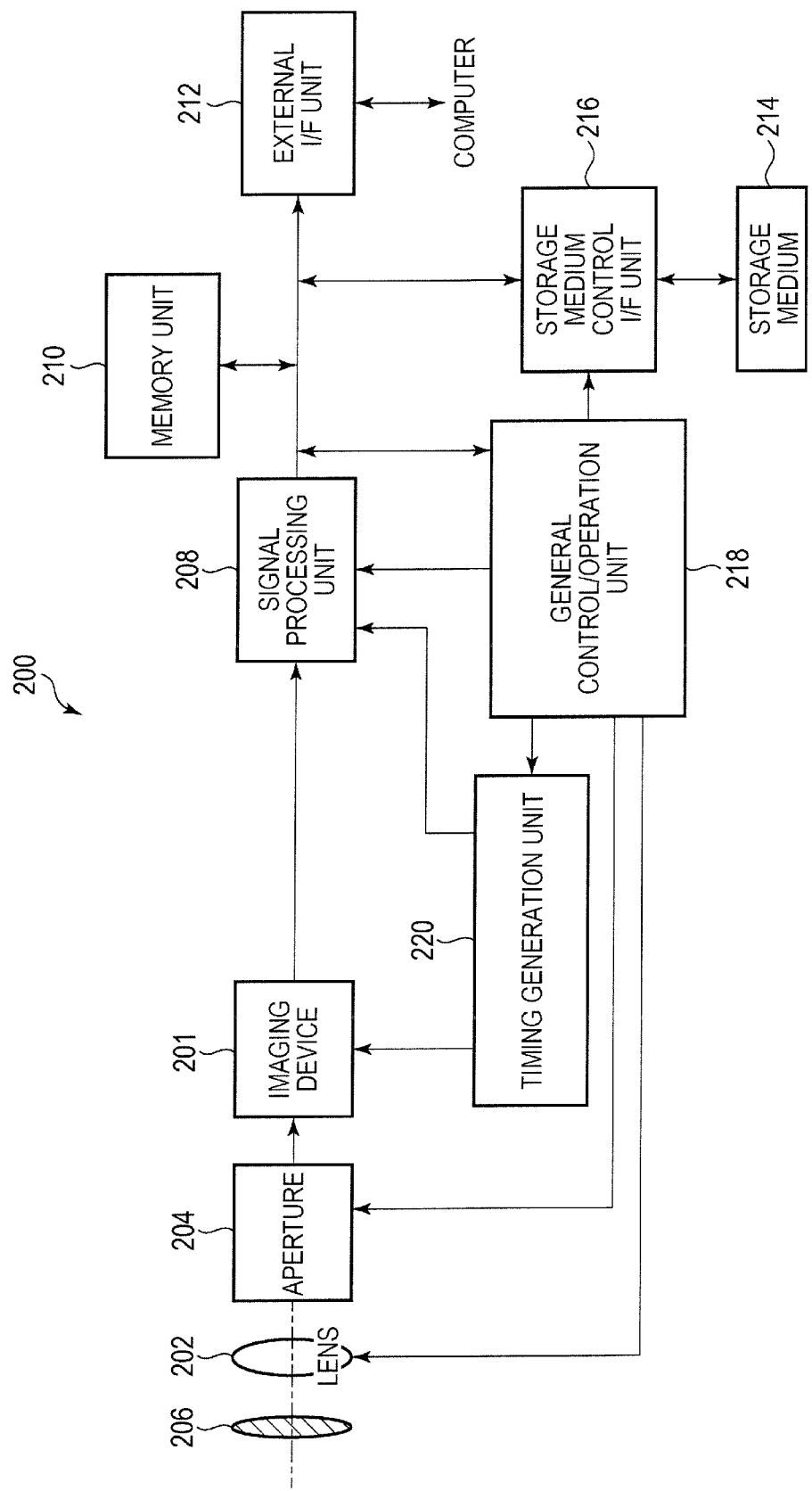

SOLID-STATE IMAGING DEVICE, METHOD OF DRIVING SOLID-STATE IMAGING DEVICE, IMAGING SYSTEM, AND MOVABLE OBJECT

BACKGROUND OF THE INVENTION

Field of the Invention

The present invention relates to a solid-state imaging device, a method of driving the solid-state imaging device, an imaging system, and a movable object.

Description of the Related Art

As photon detector, an avalanche photo diode (APD) and a single photon avalanche diode (SPAD) in which charges generated by photon incidence are amplified by avalanche breakdown are known. These photon detectors are used for capturing or ranging as a photon count sensor that counts the number of detected photons. In general, the sensor using the SPAD is formed of a photon detector, a quench element, a waveform shaper, and a signal processing circuit. An avalanche current generated by the photon detector detecting photons causes a voltage drop through the quench element and generates a photon detection signal. The photon detection signal is shaped into a pulse-like waveform by the waveform shaper, and the shaped signal is input to the signal processing circuit. Japanese Patent Application Laid-Open No. 2006-179587 discloses that detection response speed is improved by performing switching between a Geiger mode and a non-Geiger mode of a photon detector in accordance with a photon detection signal or a control signal.

When signal processing is performed on a photon detection signal, it is desirable to hold the photon detection signal for a certain period of time. However, the method disclosed in Japanese Patent Application Laid-Open No. 2006-179587 does not consider to hold a photon detection signal, and signal processing that can be performed on a photon detection signal by the post-stage signal processing circuit is limited to very simple processing. For example, in a photon count sensor having two-dimensionally arranged pixels, although each pixel can perform counting of the number of photons independently, it is difficult to perform calculation other than simple counting such as a filtering process. Further, it is difficult to perform signal processing on a plurality of pixels simultaneously.

SUMMARY OF THE INVENTION

The present invention intends to provide a solid-state imaging device and a method of driving the same that can hold a signal detected by a photon detector and perform various signal processing.

According to one aspect of the present invention, provided is a solid-state imaging device including a photon detector that operates in a Geiger mode and outputs an output signal in accordance with incidence of a photon, a quench element that causes the photon detector to transition to a non-Geiger mode in accordance with the output signal, a control unit that, when the photon detector transitions from a Geiger mode to a non-Geiger mode, switches the quench element from a detection mode, in which the quench element is in a relatively low resistance state and the photon detector detects a photon, to a hold mode, in which the quench element is in a relatively high resistance state and holds the output signal, and a signal processing circuit that performs a predetermined process on the output signal.

Further, according to another aspect of the present invention, provided is a solid-state imaging device including: a photon detector that outputs an output signal resulted from avalanche amplification of an incident photon, a transistor, which is a quench element connected to the photon detector, having a primary node connected to the photon detector and a control node, and a control unit that supplies a control signal to the control node to cause the transistor to be in an on-state at a set predetermined cycle.

Further, according to yet another aspect of the present invention, provided is a method of driving a solid-state imaging device including a photon detector that operates in a Geiger mode and outputs an output signal in accordance with incidence of a photon, a quench element that causes the photon detector to transition to a non-Geiger mode in accordance with the output signal, and a signal processing circuit that performs a predetermined process on the output signal, the method including, when the photon detector transitions from a Geiger mode to a non-Geiger mode, switching the quench element from a relatively low resistance state to a relatively high resistance state and holding the output signal by the quench element.

Further features of the present invention will become apparent from the following description of exemplary embodiments with reference to the attached drawings.

BRIEF DESCRIPTION OF THE DRAWINGS

FIG. 5 is a timing chart illustrating a method of driving the solid-state imaging device according to the second embodiment of the present invention.

FIG. 6 is a block diagram illustrating a general configuration of an imaging system according to a third embodiment of the present invention.

DESCRIPTION OF THE EMBODIMENTS

First Embodiment

A solid-state imaging device and a method of driving the same according to a first embodiment of the present invention will be described with reference to FIG. 1 to FIG. 3.

First, the structure of the solid-state imaging device according to the present embodiment will be described by using FIG. 1 and FIG. 2. FIG. 1 is a block diagram illustrating a general configuration of the solid-state imaging device according to the present embodiment. FIG. 2 is a circuit diagram illustrating a configuration example of a pixel of the solid-state imaging device according to the present embodiment.

Figure 1:
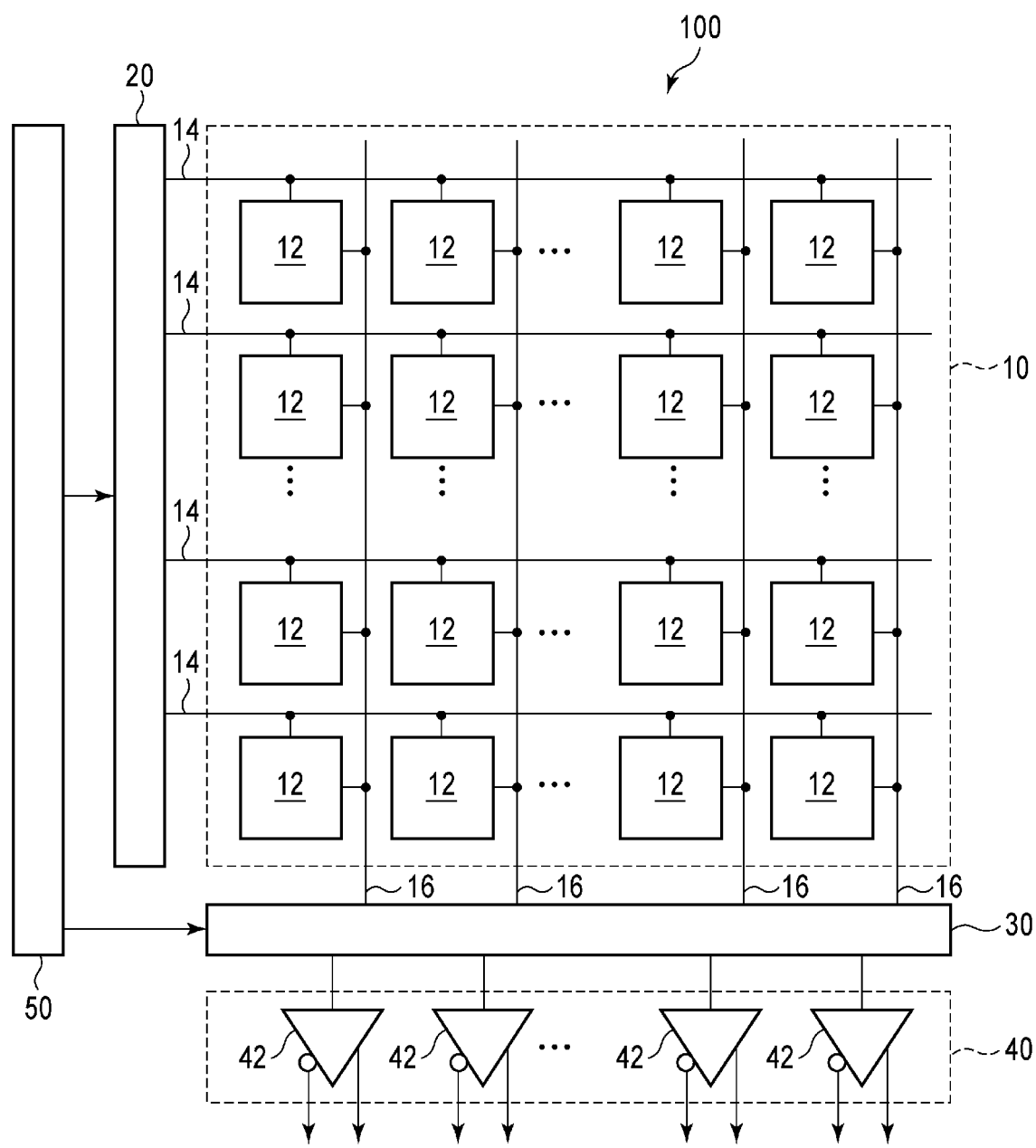
FIG. 1 is a block diagram illustrating a general configuration of a solid-state imaging device according to a first embodiment of the present invention.

As illustrated in FIG. 1, a solid-state imaging device 100 according to the present embodiment includes a pixel region 10, a vertical scanning circuit 20, a horizontal scanning circuit 30, an output circuit 40, and a control circuit 50.

In the pixel region 10, a plurality of pixels 12 arranged in a matrix over a plurality of rows and a plurality of columns are provided. The number of pixels 12 forming the pixel region 10 is not particularly limited. For example, the pixel region 10 may be formed of several thousand rows by several thousand columns of the pixels 12 as seen in general digital cameras. Alternatively, the pixel region 10 may be formed of a plurality of pixels 12 arranged in one row or one column. Alternatively, the pixel region 10 may be formed of a single pixel 12.

On each row of the pixel arrays in the pixel region 10, a control line 14 is arranged extending in a first direction (the horizontal direction in FIG. 1). Each control line 14 is connected to the pixels 12 aligned in the first direction, respectively, to form a signal line common to these pixels 12. The first direction in which the control line 14 extends may be referred to as a row direction or the horizontal direction. Each of the control lines 14 may include a plurality of signal lines used for supplying multiple types of control signal to the pixels 12.

On each column of the pixel arrays of the pixel region 10, a data line 16 is arranged extending in a second direction (the vertical direction in FIG. 1) crossing the first direction. Each data line 16 is connected to the pixels 12 aligned in the second direction, respectively, to form a signal line common to these pixels 12. The second direction in which the data line 16 extends may be referred to as a column direction or the vertical direction. Each of the data lines 16 may include a plurality of signal lines used for transferring digital signals output from the pixels 12 on a bit basis.

The control line 14 on each row is connected to the vertical scanning circuit 20. The vertical scanning circuit 20 is a circuit unit that supplies control signals used for driving the pixels 12 to the pixels 12 via the control lines 14. The vertical scanning circuit 20 sequentially scans the pixels 12 within the pixel region 10 on a row-by-row basis and outputs a pixel signal of each pixel 12 to the horizontal scanning circuit 30 via the data line 16.

The data line 16 on each column is connected to the horizontal scanning circuit 30. The horizontal scanning circuit 30 is a circuit unit that selects a pixel signal of the pixel 12 on each column output on a row-by-row basis from the pixel region 10 and sequentially outputs the selected pixel signal to the output circuit 40. The horizontal scanning circuit 30 includes a plurality of holding portions corresponding to a plurality of columns of the pixel region 10 and holds a pixel signal of the pixel 12 on each column output on a row-by-row basis from the pixel region 10 at a holding portion on the corresponding column. The horizontal scanning circuit 30 sequentially scans holding portions on respective columns and sequentially outputs pixel signals held in the holding portions on respective columns to the output circuit 40.

The output circuit 40 is a circuit unit that includes a transmitter circuit 42 and outputs the pixel signal output from the horizontal scanning circuit 30 to the outside of the solid-state imaging device 100. The transmitter circuit 42 may be formed of SERializer/DESerializer (SerDes) transmitter circuit such as a low voltage differential signaling (LVDS) circuit, a scalable low voltage signaling (SLVS) circuit, or the like, for example. Note that an external interface circuit forming the output circuit 40 is not particularly limited.

The control circuit 50 is a circuit unit used for supplying control signals that control the operation of the vertical scanning circuit 20 and the horizontal scanning circuit 30 and the timing thereof. Note that at least some of the control signals that control the operation of the vertical scanning circuit 20 and the horizontal scanning circuit 30 and the timing thereof may be supplied from the outside of the solid-state imaging device 100.

Figure 2:
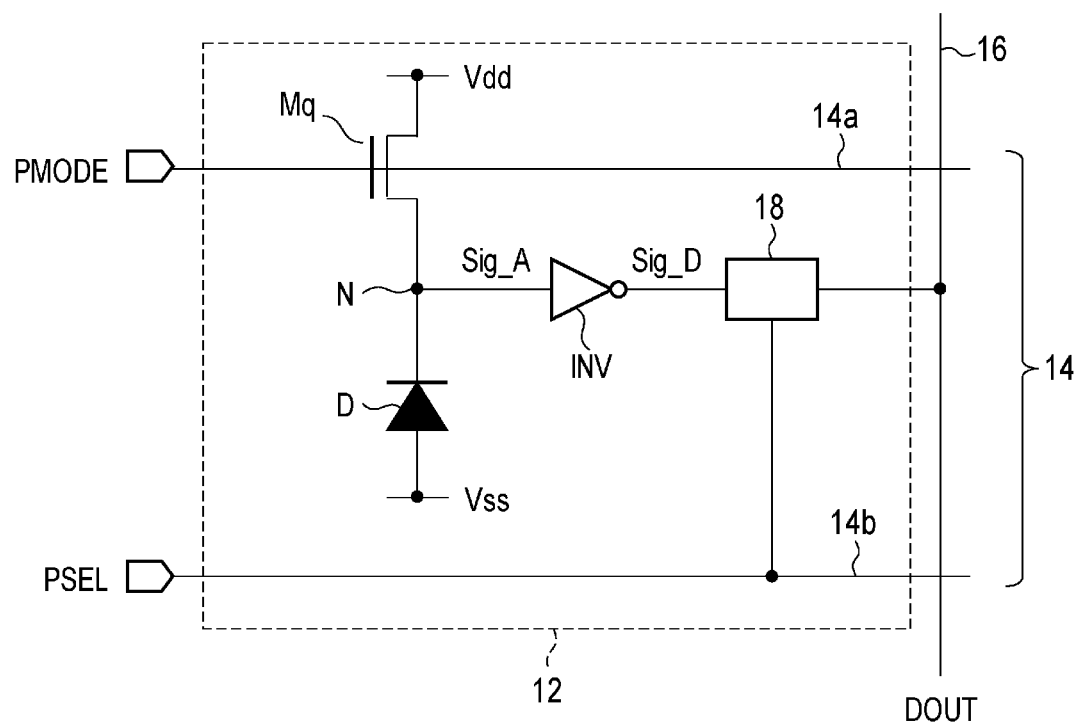
FIG. 2 is a circuit diagram illustrating a configuration example of a pixel of the solid-state imaging device according to the first embodiment of the present invention.

As illustrated in FIG. 2, each of the pixels 12 includes a photon detector D, a quench element Mq, a waveform shaper INV, and a signal processing circuit 18. The photon detector D may be formed of a photodiode such as an avalanche photo diode (APD) or a single photon avalanche diode (SPAD) in which charges generated by photon incidence are amplified by avalanche breakdown. The quench element Mq may be formed of a p-channel MOS transistor, for example. The waveform shaper INV may be formed of an inverter circuit, for example. The signal processing circuit 18 includes a counter circuit that counts the number of pulses output from the waveform shaper INV.

The anode of the photodiode forming the photon detector D is connected to the node to which a voltage Vss is supplied. The cathode of the photodiode forming the photon detector D is connected to the drain (primary node) of the p-channel MOS transistor forming the quench element Mq. The source of the p-channel MOS transistor forming the quench element Mq is connected to the node to which a voltage Vdd is supplied. The input terminal of the waveform shaper INV is connected to the connection node (node N) between the photon detector D and the quench element Mq. The output terminal of the waveform shaper INV is connected to the input terminal of the signal processing circuit 18. The output terminal of the signal processing circuit 18 is connected to the data line 16.

The gate (control node) of the p-channel MOS transistor forming the quench element Mq is supplied with a mode switch signal PMODE from the vertical scanning circuit 20 or the control circuit 50 via a control line 14a. The signal processing circuit 18 is supplied with a select signal PSEL from the vertical scanning circuit 20 via a control line 14b. The control lines 14a and 14b are signal lines forming the control line 14 described using FIG. 1. Note that the vertical scanning circuit 20 or the control circuit 50 that supplies the mode switch signal PMODE is a control unit that controls the quench element Mq so as to hold an output signal when the photon detector transitions from a Geiger mode to a non-Geiger mode.

The voltage Vss and the voltage Vdd are set so as to be able to apply, to the photon detector D, a reverse bias voltage which is sufficient for operation in a Geiger mode. In one example, a negative high voltage is applied as the voltage Vss, and a positive voltage around a power source voltage is applied as the voltage Vdd. In the present embodiment, the photodiode forming the photon detector D is operated in a Geiger mode, that is, used as a single photon avalanche diode (SPAD).

Thereby, the photon detector D is in a state where a reverse bias voltage corresponding to the potential difference between the voltage Vdd and the voltage Vss is applied. This reverse bias voltage is a voltage higher than the breakdown voltage of the photodiode forming the photon detector D and is high enough to cause avalanche amplification (Geiger mode). However, since no carrier as a seed exists in a state where no photon enters the photon detector D, no avalanche amplification occurs, and no current flows in the photon detector D (standby state).

Once photons enter the photon detector D in a standby state, carriers excited by incident photons are generated inside the photon detector D. The carriers generated inside the photon detector D are accelerated by a strong electric field inside the photon detector D and causes an avalanche amplification, and a large avalanche current occurs (Geiger mode operation). Such avalanche current flows through the quench element Mq, thereby a voltage drop is caused by the quench element Mq, and the voltage between the terminals of the photon detector D decreases. Thereby, the photon detector D exits the Geiger mode (non-Geiger mode), and the avalanche amplification stops. Carriers at the node (node N) on the cathodes side of the photon detector D are gradually drained via the quench element Mq connected as a load. Thereby, the potential at the node N returns to the initial value again.

Such a series of operations causes the node N to transition from the standby state to a voltage-dropped state resulted by a flow of a large current in the Geiger mode due to photon incidence and then return to the standby state. Such a potential change at the node N is input to the waveform shaper INV as a signal Sig_A. The waveform shaper INV shapes the waveform of the input signal Sig_A to a pulse-like signal Sig_D and outputs the pulse-like signal Sig_D to the signal processing circuit 18. The signal processing circuit 18 counts the number of pulses superimposed on the signal Sig_D output from the waveform shaper INV. Further, the signal processing circuit 18 performs predetermined signal processing on the signal Sig_D. The signal processing circuit 18 outputs an output signal DOUT, which is a signal resulted from signal processing, to the data line 16 in response to the select signal PSEL output from the vertical scanning circuit 20.

During a period when the mode switch signal PMODE is at a low level (or an on-state or an active state), the quench element Mq is in a relatively low resistance state and operates as a quench resistor (detection mode). On the other hand, during a period when the mode switch signal PMODE is at a high level (or an off-state or an inactive state), the quench element Mq is in a relatively high resistance state, blocks a current flowing into the quench element Mq, and holds the potential of the node N (hold mode).

Next, a method of driving the solid-state imaging device according to the present embodiment will be described by using FIG. 3. FIG. 3 is a timing chart illustrating the method of driving the solid-state imaging device according to the present embodiment. The timing chart of FIG. 3 illustrates the timing when a photon enters the photon detector D, the mode switch signal PMODE, the signal Sig_A, the signal Sig_D, the count value in the counter, the select signal PSEL, and the output signal DOUT.

At time t10, the mode switch signal PMODE is at a low level, and the quench element Mq is in the detection mode. No photon has entered the photon detector D, the signal Sig_A is a predetermined potential indicating the standby state, and the signal Sig_D is at a low level. Further, at the time t10, the count value of the counter is zero, and the select signal PSEL is at a low level.

At time t11, incidence of a photon occurs. In response, avalanche amplification occurs in the photon detector D with carriers excited with the incident photon being as a seed, and a flow of an avalanche current causes the potential at the node N to decrease. In response to the decrease of the potential at the node N, the potential of the signal Sig_A decreases.

On and after the time t11, the potential of the signal Sig_A gradually increases as electrons generated in the photon detector D are gradually drained via the quench element Mq.

In response to the decrease of the potential of the signal Sig_A, the signal Sig_D transitions from the low level to the high level at time t12. The counter of the signal processing circuit 18 increments the count value by one in response to a rising edge of the signal Sig_D. Thereby, the count value in the counter becomes one.

At time t13, the vertical scanning circuit 20 controls the mode switch signal PMODE from the low level to the high level. Thereby, the quench element Mq is in a high resistance state, draining of electrons generated in the photon detector D stops, and the increase of the potential of the signal Sig_A stops. That is, the signal Sig_A is held at a constant value.

At time t14, the vertical scanning circuit 20 controls the mode switch signal PMODE from the high level to the low level. Thereby, the quench element Mq is in a low resistance state (on-state), that is, in the detection mode. In response to the transition of the quench element Mq to the low resistance state, draining of electrons via the quench element Mq is resumed, and the potential of the signal Sig_A gradually increases to a predetermined potential indicating the standby state.

At time t15, when the potential of the signal Sig_A increases to a predetermined value, the signal Sig_D transitions from the high level to the low level and returns to the standby state.

At subsequent time t16, another incidence of a photon occurs. In response, avalanche amplification occurs in the photon detector D with carriers excited by the incident photon being as a seed, and a flow of an avalanche current causes the potential at the node N to decrease. In response to the decrease of the potential at the node N, the potential of the signal Sig_A decreases.

On and after the time t16, the potential of the signal Sig_A gradually increases as electrons generated in the photon detector D are gradually drained via the quench element Mq.

In response to the decrease of the potential of the signal Sig_A due to incidence of a photon, the signal Sig_D transitions from the low level to the high level at time t17. The counter of the signal processing circuit 18 increments the count value by one in response to the rising edge of the signal Sig_D. Thereby, the count value in the counter becomes two.

At time t18, the vertical scanning circuit 20 controls the mode switch signal PMODE from the low level to the high level. Thereby, the quench element Mq is in a high resistance state, draining of electrons generated in the photon detector D stops, and the increase of the potential of the signal Sig_A stops. That is, the signal Sig_A is held at a constant value.

At time t19, the vertical scanning circuit 20 controls the select signal PSEL from the low level to the high level. Thereby, the output signal DOUT indicating the count value of two in the counter of the signal processing circuit 18 is output to the data line 16.

Figure 3:
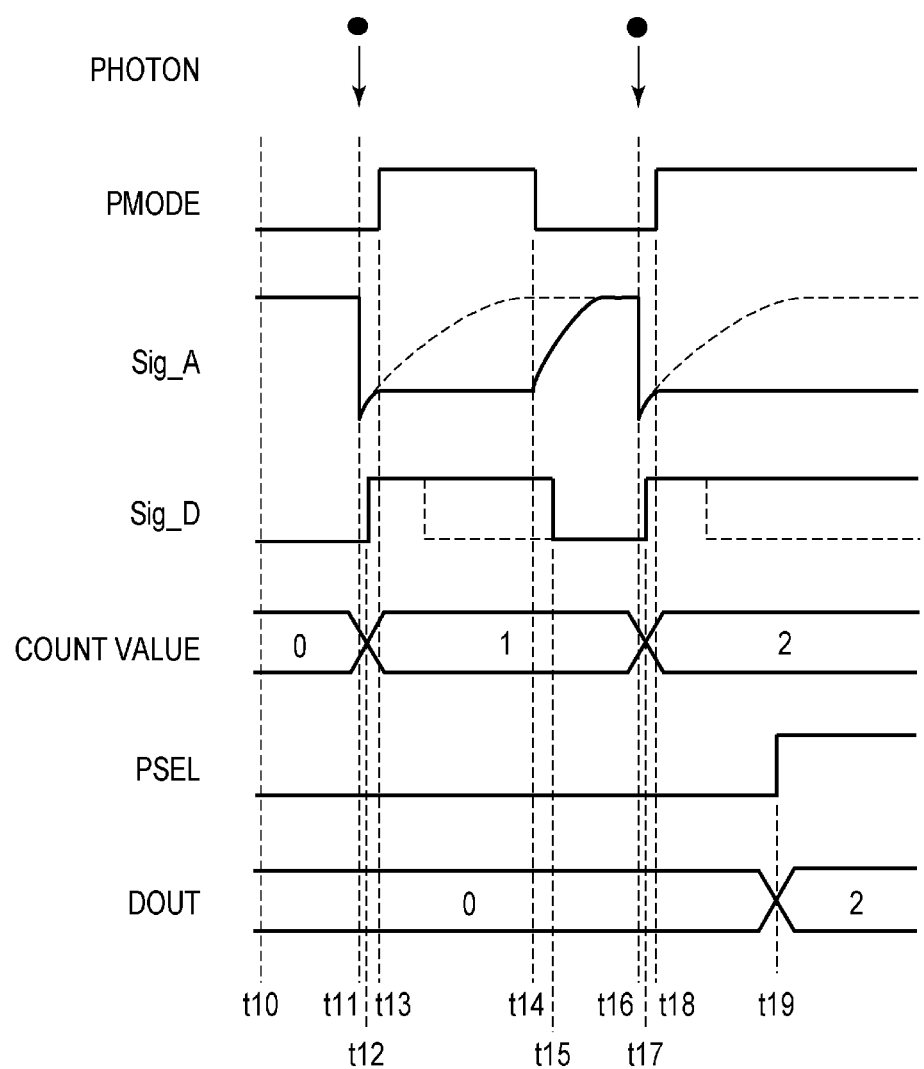
FIG. 3 is a timing chart illustrating a method of driving the solid-state imaging device according to the first embodiment of the present invention.

In FIG. 3, the signal waveforms of the signal Sig_A and the signal Sig_D when the resistance of the quench element Mq is constant (detection mode) are illustrated by dotted lines. In this case, the potential of the signal Sig_A continuously increases toward the potential of the standby state and is unable to be held at a constant value. Thus, signal processing that needs to be held for a certain period of time cannot be performed on the signal Sig_A.

In contrast, in the method of driving the solid-state imaging device according to the present embodiment, the potential of the signal Sig_A can be held at a constant level during the period of time t13 to time t14 and a period on and after time t18 in which the mode switch signal PMODE is controlled to the high level. Therefore, according to the present embodiment, signal processing that needs to be held for a certain period of time can be performed on the signal Sig_A.

That is, when signal processing that needs to be held for a certain period of time is performed on the signal Sig_A, the mode switch signal PMODE is held at the low level. Thereby, during a period in which the signal processing circuit 18 performs signal processing, that is, a period in which the signal processing circuit 18 does not accept input, the photon detector D can be held in the hold mode, and power consumption can be reduced. The process performed by the signal processing circuit 18 is not particularly limited, which may be, for example, a filtering process, signal processing performed simultaneously on the plurality of pixels 12, or the like.

Further, when the signal processing circuit 18 performs only the process that requires substantially no period for holding an input signal, for example, a simple counting process, it is possible to set a longer period for detecting photons and increase detection sensitivity of photons by setting a shorter period of the hold mode.

Further, an operation in a non-hold mode in which the mode switch signal PMODE is maintained at the high level during an integration period from the start to the end of integration of count values in the counter may be used. This integration period is a period determined from an exposure condition such as a framerate, an aperture, a set ISO sensitivity, a shutter speed, or the like. The solid-state imaging device of the present embodiment can perform switching between an operation having the hold mode described in the present embodiment and an operation in the non-hold mode.

An example of selection of the operation having the hold mode described in the present embodiment and the operation in the non-hold mode will be described. For example, the operation in the non-hold mode is used when the set ISO sensitivity is relatively high (a high sensitivity mode), and the operation having the hold mode described in the present embodiment is used when the set ISO sensitivity is relatively low (a low sensitivity mode).

When the set ISO sensitivity is set relatively high, it is often the case of capturing a low light amount capturing scene. In such a low light amount scene, it is preferable to shorten a period in which the photon detector D is in a non-Geiger mode to enable detection of a small amount of incident photons.

On the other hand, when the set ISO sensitivity is set relatively low, it is often the case of capturing a high light amount capturing scene. When operated in the non-hold mode, an SPAD tends to require time to return to a Geiger mode from a non-Geiger mode and be unable to detect photons entering the photon detector D during the time period. Therefore, increase of a signal value of the output signal DOUT of the pixel 12 no longer responds to increase of an incident light amount. That is, the linearity of the output signal DOUT of the pixel 12 relative to an incident light amount decreases as the incident light amount increases.

Accordingly, in such a high light amount scene, during the operation having the hold mode described in the present embodiment, that is, the integration period, a period in which the mode switch signal PMODE is at the high level is provided for n times. Each of the n times of periods is referred to as a sub-integration period. By deriving the ratio of a count value to the number n, it is possible to estimate the amount of light entering the photon detector D. That is, in each of the n times of sub-integration periods, as the frequency of a photon entering the photon detector D increases, the count value in the counter approaches n. For example, when the count value becomes n, this indicates that photons enter the photon detector D in all the sub-integration periods, which indicates that the amount of light entering the photon detector D is large.

When a signal of the solid-state imaging element is used to generate an image, the luminance at an image position corresponding to the pixel 12 can be defined as the maximum value (typically, white). In such a way, by using the mode switch signal PMODE to provide sub-integration periods, it is possible to derive a ratio of the count value in the counter relative to the number of times of sub-integration periods. Thereby, the linearity of a signal value of the output signal DOUT of the pixel 12 relative to an increase of the incident light mount can be increased.

As discussed above, according to the present embodiment, a signal detected by the photon detector can be held for a desired time period, and various signal processing can be performed in the post-stage signal processing circuit.

Second Embodiment

A solid-state imaging device and a method of driving the same according to a second embodiment of the present invention will be described with reference to FIG. 4 and FIG. 5. The same components as those in the solid-state imaging device according to the first embodiment will be labeled with the same references, and the description thereof will be omitted or simplified.

First, the structure of the solid-state imaging device according to the present embodiment will be described by using FIG. 4. FIG. 4 is a circuit diagram illustrating a configuration example of a pixel of the solid-state imaging device according to the present embodiment.

Figure 4:
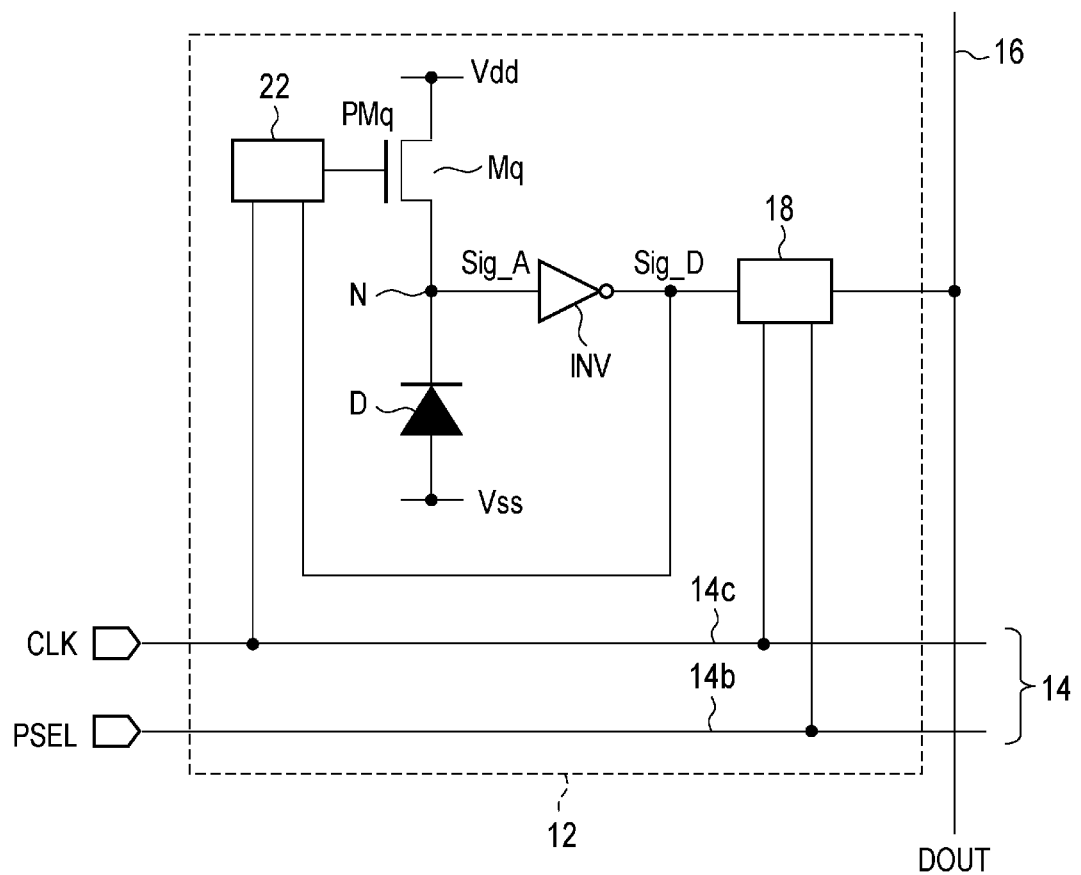
FIG. 4 is a circuit diagram illustrating a configuration example of a pixel of a solid-state imaging device according to a second embodiment of the present invention.

As illustrated in FIG. 4, the pixel 12 of the solid-state imaging device according to the present embodiment further includes a quench element control circuit 22 in addition to the photon detector D, the quench element Mq, a waveform shaper INV, and the signal processing circuit 18. Other configurations of the solid-state imaging device according to the present embodiment are basically the same as the solid-state imaging device according to the first embodiment.

The anode of the photodiode forming the photon detector D is connected to the node to which a voltage Vss is supplied. The cathode of the photodiode forming the photon detector D is connected to the drain of the p-channel MOS transistor forming the quench element Mq. The source of the p-channel MOS transistor forming the quench element Mq is connected to the node to which a voltage Vdd is supplied. The gate of the p-channel MOS transistor forming the quench element Mq is connected to the output terminal of the quench element control circuit 22. The input terminal of the waveform shaper INV is connected to the connection node (node N) between the photon detector D and the quench element Mq. The output terminal of the waveform shaper INV is connected to the input terminal of the signal processing circuit 18 and the input terminal of the quench element control circuit 22. The output terminal of the signal processing circuit 18 is connected to the data line 16.

The signal processing circuit 18 is supplied with the select signal PSEL from the vertical scanning circuit 20 via the control line 14b. Further, the signal processing circuit 18 and the quench element control circuit 22 are supplied with a control signal CLK from the vertical scanning circuit 20 or the control circuit 50 via a control line 14c. The control lines 14b and 14c are signal lines forming the control line 14 described using FIG. 1. The control signal CLK is a timing signal that determines operation timings of the solid-state imaging device, which may be a signal based on a clock signal, for example. Note that the quench element control circuit 22 is a control unit that controls the quench element so that the photon detector holds an output signal when transitioning from a Geiger mode to a non-Geiger mode.

As described in the first embodiment, the node N transitions from the standby state to a voltage-dropped state resulted by a flow of a large current in the Geiger mode due to photon incidence and then returns to the standby state. Such a potential change at the node N is input to the waveform shaper INV as a signal Sig_A. The waveform shaper INV shapes the waveform of the input signal Sig_A to a pulse-like signal Sig_D and outputs the pulse-like signal Sig_D to the signal processing circuit 18 and the quench element control circuit 22.

The signal processing circuit 18 performs counting of the number of pulses or predetermined signal processing in synchronization with the control signal CLK. For example, when the signal Sig_D is at a high level at the timing of a falling edge of the control signal CLK, the signal processing circuit 18 counts this pulse. Further, the signal processing circuit 18 performs predetermined signal processing on the signal Sig_D in accordance with the timing of the control signal CLK. The signal processing circuit 18 outputs an output signal DOUT, which is a signal resulted from signal processing, to the data line 16 in response to the select signal PSEL output from the vertical scanning circuit 20.

The quench element control circuit 22 detects a rising edge of the signal Sig_D output from the waveform shaper INV and controls a quench element control signal PMq output to the gate of the quench element Mq from a high level to a low level. Further, the quench element control circuit 22 detects a rising edge of the control signal CLK and controls a quench element control signal PMq output to the gate of the quench element Mq from a low level to a high level. The control signal CLK is an example of a periodic signal whose signal value changes periodically. Further, in the present embodiment, such a periodic signal is input commonly to the quench element control circuit 22 and the signal processing circuit 18.

During a period when the quench element control signal PMq is at a high level, the quench element Mq is in a relatively low resistance state and operates as a quench resistor (detection mode). On the other hand, during a period when the quench element control signal PMq is at a low level, the quench element Mq is in a relatively high resistance state, blocks a current flowing to the quench element Mq, and holds the potential of the node N (hold mode).

Next, a method of driving the solid-state imaging device according to the present embodiment will be described by using FIG. 5. FIG. 5 is a timing chart illustrating the drive method of the solid-state imaging device according to the present embodiment. The timing chart of FIG. 5 illustrates the timing when a photon enters the photon detector D, the control signal CLK, the quench element control signal PMq, the signal Sig_A, the signal Sig_D, the count value in the counter, the select signal PSEL, and the output signal DOUT.

At time t20, the quench element control signal PMq is at a low level, and the quench element Mq is in the detection mode. No photon has entered the photon detector D, the signal Sig_A is a predetermined potential illustrating the standby state, and the signal Sig_D is at a low level. Further, at the time t20, the count value of the counter is zero, and the select signal PSEL is at a low level.

At time t21, incidence of a photon occurs. In response, avalanche amplification occurs in the photon detector D with carriers excited by the incident photon being as a seed, and a flow of an avalanche current causes the potential at the node N to decrease. In response to the decrease of the potential at the node N, the potential of the signal Sig_A decreases.

On and after the time t21, the potential of the signal Sig_A gradually increases as electrons generated in the photon detector D are gradually drained via the quench element Mq.

At time t22, in response to the decrease of the potential of the signal Sig_A, the signal Sig_D transitions from the low level to the high level.

At time t23, the quench element control circuit 22 detects the rising edge of the signal Sig_D supplied from the waveform shaper INV and controls the quench element control signal PMq from the low level to the high level. Thereby, the quench element Mq is in a high resistance state, draining of electrons generated in the photon detector D stops, and the increase of the potential of the signal Sig_A stops. That is, the signal Sig_A is held at a constant value. The quench element control circuit 22 maintains the quench element control signal PMq at the high level while the control signal CLK is at the low level.

At time t24, the signal processing circuit 18 increments the count value by one in response to the falling edge of the control signal CLK. Thereby, the count value in the counter becomes one.

At time t25, the quench element control circuit 22 detects the rising edge of the control signal CLK and controls the quench element control signal PMq from the high level to the low level. Thereby, the quench element Mq is in a low resistance state, that is, in the detection mode. In response to the transition of the quench element Mq to the low resistance state, draining of electrons via the quench element Mq is resumed, and the potential of the signal Sig_A gradually increases to a predetermined potential indicating the standby state.

At time t26, when the potential of the signal Sig_A increases to a predetermined value, the signal Sig_D transitions from the high level to the low level, and returns to the standby state.

At subsequent time t27, another incidence of a photon occurs. In response, avalanche amplification occurs in the photon detector D with carriers excited by the incident photon being as a seed, and a flow of an avalanche current causes the potential at the node N to decrease. In response to the decrease of the potential at the node N, the potential of the signal Sig_A decreases.

On and after the time t27, the potential of the signal Sig_A gradually increases as electrons generated in the photon detector D are gradually drained via the quench element Mq.

At time t28, in response to the decrease of the potential of the signal Sig_A due to incidence of a photon, the signal Sig_D transitions from the low level to the high level.

At time t29, the quench element control circuit 22 detects the rising edge of the signal Sig_D supplied from the signal processing circuit 18 and controls the quench element control signal PMq from the low level to the high level. Thereby, the quench element Mq is in a high resistance state, draining of electrons generated in the photon detector D stops, and the increase of the potential of the signal Sig_A stops. That is, the signal Sig_A is held at a constant value.

At time t30, the signal processing circuit 18 increments the count value by one in response to the falling edge of the control signal CLK. Thereby, the count value in the counter becomes two.

At time t31, the vertical scanning circuit 20 controls the select signal PSEL from the low level to the high level. Thereby, the output signal DOUT indicating the count value of two in the counter of the signal processing circuit 18 is output to the data line 16.

Note that, while the case where incidence of a photon occurs in a period in which the control signal CLK is at a high level has been assumed in the example described above, the quench element Mq is in a hold mode when incidence of a photon occurs in a period in which the control signal CLK is at a high level, and the signals Sig_A and Sig_D do not change. That is, in the solid-state imaging device according to the present embodiment, detection of a photon and signal processing on the signal Sig_D are enabled in synchronization with the control signal CLK.

In FIG. 5, the signal waveforms of the signal Sig_A and the signal Sig_D when the resistance of the quench element Mq is constant (detection mode) are illustrated by doted lines. In this case, the potential of the signal Sig_A continuously increases toward the potential of the standby state and is unable to be held at a constant value. Thus, signal processing that needs to be held for a certain period of time cannot be performed on the signal Sig_A.

In contrast, in the method of driving the solid-state imaging device according to the present embodiment, the potential of the signal Sig_A can be held at a constant level during the period of time t23 to time t25 and a period on and after time t29 in which the quench element control signal PMq is controlled to the high level. Therefore, according to the present embodiment, signal processing that needs to be held for a certain period of time can be performed on the signal Sig_A.

In particular, in the present embodiment, since the quench element Mq is switched to the hold mode in accordance with the level of the signal Sig_D, switching of the quench element Mq to the hold mode can be performed independently on a pixel 12 basis immediately after photon detection. Therefore, the present embodiment is a more preferable form than the first embodiment in terms of reduction of consumption power.

Further, since the quench element Mq is switched to the detection mode when the control signal CLK becomes a high level, the present embodiment is a more preferable form also when signal processing across a plurality of pixels 12 is performed, such as when detection results at a certain timing of the plurality of pixels 12 are intended to be acquired at the same time, for example.

Further, while the same control signal CLK is input to the quench element control circuit 22 and the signal processing circuit 18 in the present embodiment, the embodiment is not limited to this example. For example, separate control signals may be supplied to the signal processing circuit 18 and the quench element control circuit 22. Further, as another example, a frequency division circuit, which divides the frequency of the control signal CLK, is provided in the pre-stage of the quench element control circuit 22. Further, a signal resulted by dividing the frequency of the control signal CLK may be input from the frequency division circuit to the quench element control circuit 22. Including the above form in which a signal resulted by dividing the frequency of the control signal CLK is input to the quench element control circuit 22, a form in which a signal based on the control signal CLK is input to the quench element control circuit 22 is preferable.

As discussed above, according to the present embodiment, a signal detected by the photon detector can be held for a desired time period, and various signal processing can be performed on the post-stage signal processing circuit. Further, detection of photons or signal processing can be performed in response to a timing signal, and a synchronous system of photo-counting can be realized.

Note that, also in the present embodiment, as described in the first embodiment, an operation having the hold mode described in the present embodiment or an operation in the non-hold mode can be appropriately used. For example, the operation in the non-hold mode is used when the set ISO sensitivity is relatively high (a high sensitivity mode), and the operation having the hold mode described in the present embodiment is used when the set ISO sensitivity is relatively low (a low sensitivity mode).

During the operation having the hold mode described in the present embodiment, that is, the integration period, n times of sub-integration periods are provided. In the present embodiment, these sub-integration periods are respective periods in which the control signal CLK is at the high level. By deriving the ratio of a count value to the number n, it is possible to estimate the amount of light entering the photon detector D. That is, in each of then times of sub-integration periods, as the frequency of a photon entering the photon detector D increases, the count value in the counter approaches n. For example, when the count value becomes n, this indicates that photons enter the photon detector D in all the sub-integration periods, which indicates that the amount of light entering the photon detector D is large.

When a signal of the solid-state imaging element is used to generate an image, the luminance at an image position corresponding to the pixel 12 can be defined as the maximum value (typically, white). In such a way, by using the mode switch signal PMODE to provide sub-integration periods, it is possible to derive a ratio of the count value in the counter relative to the number of times of sub-integration periods. Thereby, the linearity of a signal value of the output signal DOUT of the pixel 12 relative to an increase of the incident light mount can be increased. Further, an increase in the frequency of the control signal CLK allows the linearity to be higher.

Third Embodiment

An imaging system according to a third embodiment of the present invention will be described with reference to FIG. 6. FIG. 6 is a block diagram illustrating a general configuration of the imaging system according to the present embodiment.

The solid-state imaging device 100 described in the first and second embodiments described above can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 6 illustrates a block diagram of a digital still camera as an example out of these examples.

The imaging system 200 illustrated as an example in FIG. 6 includes an imaging device 201, a lens 202 that captures an optical image of an object onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 210 is the solid-state imaging device 100 described in the first or second embodiment and converts an optical image captured by the lens 202 into image data.

The imaging system 200 further includes a signal processing unit 208 that processes an output signal output from the imaging device 201. The signal processing unit 208 preforms an AD-conversion that converts an analog signal output by the imaging device 201 into a digital signal. In addition, the signal processing unit 208 performs various correction and compression other than above, if necessary, and outputting image data. An AD-conversion unit, which is a part of the signal processing unit 208, may be formed on a semiconductor substrate on which the imaging device 201 is provided or a semiconductor substrate on which the imaging device 201 is not provided. Further, the imaging device 201 and the signal processing unit 208 may be formed on the same semiconductor substrate.

The imaging system 200 further includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

The imaging system 200 further includes a general control/operation unit 218 that controls various operations and the entire digital still camera and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image.

As discussed above, according to the present embodiment, the imaging system to which the solid-state imaging device 100 according to the first or second embodiment is applied can be realized.

Fourth Embodiment

Figure 7A:
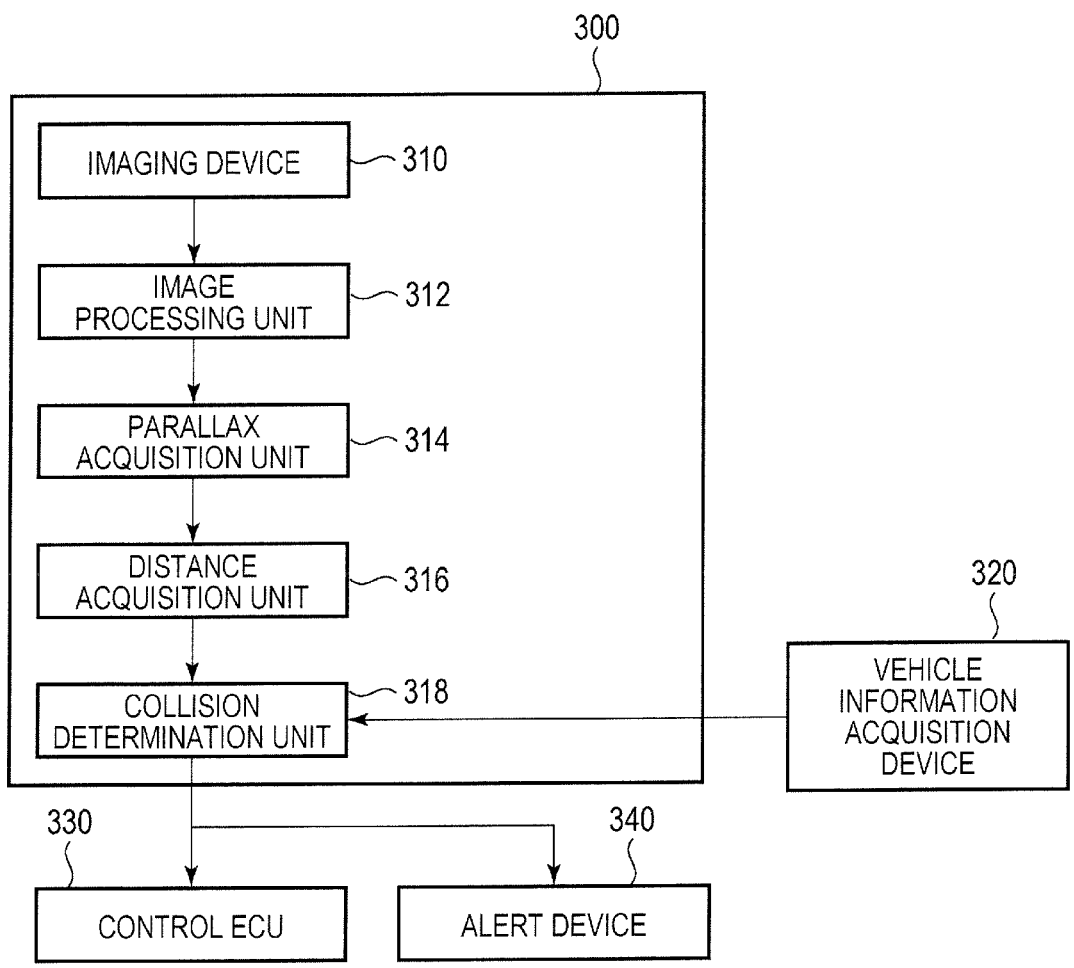
FIG. 7A is a diagram illustrating a configuration example of an imaging system according to a fourth embodiment of the present invention.
Figure 7B:
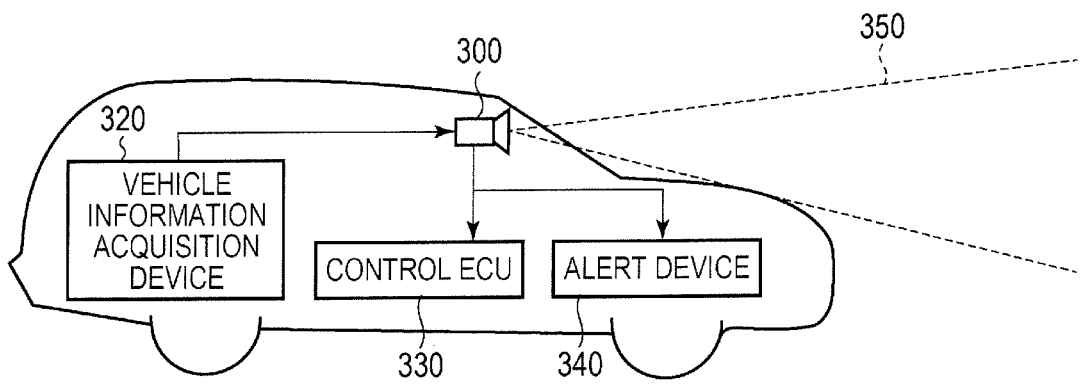
FIG. 7B is a diagram illustrating a configuration example of a movable object according to the fourth embodiment of the present invention.

An imaging system and a movable object according to a fourth embodiment of the present invention will be described with reference to FIG. 7A and FIG. 7B. FIG. 7A is a diagram illustrating a configuration of an imaging system according to the present embodiment. FIG. 7B is a diagram illustrating a configuration of a movable object according to the present embodiment.

FIG. 7A illustrates an example of an imaging system related to an on-vehicle camera. The imaging system 300 includes an imaging device 310. The imaging device 310 is the solid-state imaging device 100 described in any of the above first and second embodiments. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 7B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, while a solid-state imaging device in which the pixels 12 are arranged two-dimensionally inside the pixel region 10 has been assumed in the embodiments described above, the arrangement of the pixels 12 is not limited to be two-dimensional. For example, a solid-state imaging device may be formed of a single pixel 12, or the pixels 12 may be arranged one-dimensionally or three-dimensionally.

Further, while each of the control lines 14 is used as a signal line common to all the pixels 12 on each row and each of the data lines 16 is used as a signal line common to all the pixels 12 on each column in the embodiments described above, the arrangement of the control lines 14 and the data lines 16 is not limited thereto. For example, a common control line 14 or a common data line 16 may be arranged on a block basis in a unit of i row(s) by j column(s) (i and j are both natural numbers).

Further, the imaging systems illustrated in the above third and fourth embodiments are examples of an imaging system to which the photoelectric conversion device of the present invention may be applied, and an imaging system to which the photoelectric conversion device of the present invention can be applied is not limited to the configuration illustrated in FIG. 6 and FIG. 7A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-067058, filed Mar. 30, 2018 which is hereby incorporated by reference herein in its entirety.

What is claimed is:

1. A photoelectric conversion device comprising:
   a photon detector that operates in a Geiger mode and outputs an output signal in accordance with incidence of a photon;
   a quench transistor that causes the photon detector to transition to a non- Geiger mode;
   a control circuit that supplies a control signal to a gate of the quench transistor and, when the photon detector transitions from a Geiger mode to a non-Geiger mode, switches the quench transistor from a detection mode, in which the quench transistor is in a relatively low resistance state and the photon detector detects a photon, to a hold mode, in which the quench transistor is in a relatively high resistance state and holds the output signal; and
   a signal processing circuit that performs a predetermined process on the output signal,
   wherein the control circuit determines a period of the hold mode from an exposure condition.

2. The photoelectric conversion device according to claim 1, wherein the control circuit controls the quench transistor in accordance with the output signal from the photon detector.

3. The photoelectric conversion device according to claim 1, wherein the control circuit switches the quench transistor from the hold mode to the detection mode in response to transition of a timing signal, which determines an operation timing, from a first level to a second level,
   wherein the timing signal is input to the control circuit.

4. The photoelectric conversion device according to claim 3, wherein the control circuit sets the quench transistor in the hold mode during a period in which the timing signal is at the first level.

5. The photoelectric conversion device according to claim 4, wherein the output signal does not change during a period in which the timing signal is at the first level.

6. The photoelectric conversion device according to claim 3, wherein the signal processing circuit performs the predetermined process in synchronization with the timing signal.

7. The photoelectric conversion device according to claim 1, wherein the detection mode corresponds to a state where the quench transistor is in an on-state, and the hold mode corresponds to a state where the quench transistor is in an off-state.

8. The photoelectric conversion device according to claim 1,
   wherein the signal processing circuit includes a counter that performs integration of the number of times of a change of the output signal,
   wherein the photoelectric conversion device is capable of selecting an operation out of a plurality of operations including a first operation and a second operation,
   wherein the first operation is an operation in which the control circuit controls the quench transistor so that the photon detector holds the output signal when transitioning from a Geiger mode to a non-Geiger mode over a period from start to end of the integration performed by the counter, and
   wherein the second operation is an operation in which the control circuit unit controls the quench transistor so that the photon detector does not hold the output signal when transitioning from a Geiger mode to a non-Geiger mode over a period from start to end of the integration performed by the counter and the photon detector transitions from a non-Geiger mode to a Geiger mode.

9. The photoelectric conversion device according to claim 1, wherein the output signal is a digital signal shaped into a pulse-like waveform from an analog signal output from the photon detector.

10. The photoelectric conversion device according to claim 1 further comprising a plurality of pixels each including the photon detector, the quench transistor, the control circuit, and the signal processing circuit.

11. An imaging system comprising:
    the photoelectric conversion device according to claim 1; and
    a signal processing unit that processes a signal output from the photoelectric conversion device.

12. A movable object comprising:
    the photoelectric conversion device according to claim 1;
    a distance information acquisition unit that acquires distance information on a distance to an object, from parallax images based on a signal from the photoelectric conversion device; and
    a control unit that controls the movable object based on the distance information.

13. The photoelectric conversion device according to claim 1, wherein the exposure condition is at least one of a framerate, an aperture, a set ISO sensitivity, and a shutter speed.

14. The photoelectric conversion device according to claim 1, further comprising a plurality of pixels each including the photon detector, wherein the control circuit is one of a vertical scanning circuit configured to control the plurality of pixels and a control circuit configured to control the vertical scanning circuit.

15. A photoelectric conversion device comprising:
a photon detector that outputs an output signal resulted from avalanche amplification of an incident photon;
a quench transistor connected to the photon detector, the quench transistor having a primary node connected to the photon detector, a secondary node connected to a voltage node, and a control node; and
a control circuit that supplies a control signal to the control node to cause the transistor to be in an on-state at a set predetermined cycle.

16. The photoelectric conversion device according to claim 15 further comprising:
a signal processing circuit to which the output signal is input,
wherein a periodic signal whose signal value changes periodically is input to the control circuit and the signal processing circuit, and
wherein the control signal is a signal based on the periodic signal.

17. The photoelectric conversion device according to claim 15, wherein the control signal is a signal based on a clock signal.

18. The photoelectric conversion device according to claim 17, wherein the control signal is a signal resulted by dividing a frequency of the clock signal.

19. The photoelectric conversion device according to claim 15,
wherein the signal processing circuit includes a counter that performs integration of the number of times of a change of the output signal,
wherein the photoelectric conversion device is capable of selecting an operation out of a plurality of operations including a first operation and a second operation,
wherein the first operation is an operation in which the control circuit causes the transistor to be in an on-state repeatedly at a set predetermined cycle over a period from start to end of the integration performed by the counter, and
wherein the second operation is an operation in which the control circuit maintains the transistor in an on-state over a period from start to end of the integration performed by the counter.

20. The photoelectric conversion device according to claim 15, wherein the output signal is a digital signal shaped into a pulse-like waveform from an analog signal output from the photon detector.

21. The photoelectric conversion device according to claim 15 further comprising a plurality of pixels each including the photon detector, the quench transistor, the control circuit, and the signal processing circuit.

22. The photoelectric conversion device according to claim 15, further comprising a plurality of pixels each including the photon detector,
wherein the control circuit is one of a vertical scanning circuit configured to control the plurality of pixels and a control circuit configured to control the vertical scanning circuit.

23. The photoelectric conversion device according to claim 15, wherein the control circuit controls the quench transistor in accordance with the output signal from the photon detector.

24. The photoelectric conversion device according to claim 23, wherein the signal processing circuit performs the predetermined process in synchronization with the control signal.

* * * * *